(12) United States Patent
Cheng et al.

(10) Patent No.: US 6,879,003 B1
(45) Date of Patent: Apr. 12, 2005

(54) ELECTROSTATIC DISCHARGE (ESD) PROTECTION MOS DEVICE AND ESD CIRCUITRY THEREOF

(75) Inventors: Chih-Nan Cheng, I-Lan Hsien (TW); Yii-Chian Lu, Taipei (TW); Fang-Mei Chao, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/710,096

(22) Filed: Jun. 18, 2004

(51) Int. Cl.[7] .............................................. H01L 23/62
(52) U.S. Cl. ...................... 257/355; 257/356; 257/357
(58) Field of Search ................................ 257/328, 339, 257/341, 355–357

(56) References Cited

U.S. PATENT DOCUMENTS 5,870,268 A  2/1999 Lin et al.
6,399,990 B1 * 6/2002 Brennan et al. ............ 257/355

* cited by examiner

*Primary Examiner*—Thien F Tran
(74) *Attorney, Agent, or Firm*—Winston Hsu

(57) ABSTRACT

An NMOS device having protection against electrostatic discharge. The NMOS device includes a P-substrate, a P-epitaxial layer overlying the P-substrate, a P-well in the P-epitaxial layer, an N-well in the P-epitaxial layer and encompassing the P-well, an N-Buried Layer (NBL) underneath the P-well and bordering the N-well. The P-well is fully isolated by the N-well and the NBL. The NMOS device further includes a first isolation structure consisting of a gate-insulating layer connected with a field oxide layer, which is formed on the P-epitaxial layer. A gate overlies the first isolation structure. A second isolation structure laterally spaced apart from the first isolation structure is approximately situated on the N-well. An N[+] source doping region, which functions as a source of the NMOS device, is disposed in the P-well. An N[+] drain doping region, which functions as a drain of the NMOS device, is disposed in the N-well.

25 Claims, 3 Drawing Sheets

US 6,879,003 B1

ELECTROSTATIC DISCHARGE (ESD) PROTECTION MOS DEVICE AND ESD CIRCUITRY THEREOF

BACKGROUND OF INVENTION

1. Field of the Invention

The present invention relates to electrostatic discharge (ESD) protection of circuitry. More particularly, the present invention relates to ESD protection NMOS devices with enhanced triggering property and improved ESD robustness. According to one preferred embodiment of the present invention, an improved ESD protection NMOS device possessing a trigger voltage of about 43 volts and a second breakdown current (It2) of up to 2300 mA (measured by the transmission line pulse generator) is obtained.

2. Description of the Prior Art

Electro-static discharge (ESD) is a significant problem in integrated circuit design, especially for devices with high pin counts and circuit speeds. ESD refers to the phenomena wherein a high-energy electrical discharge of current is produced at the input and/or output nodes of an integrated circuit (IC) device as a consequence of static charge build-up on the IC package. The static charge build up can result from handling of the IC device by a human body or from handling by IC device manufacturing equipments. It is known that the inadvertent presence of a sudden voltage spike in an integrated circuit can cause physical destruction of circuit features. For example, ESD-induced spikes can rupture the thin gate oxide of a field effect transistor (FET), or simply degrade the P-N junction of a semiconductor device, effectively destroying proper IC operation. A typical "gate oxide" in a MOS transistor will rupture when its dielectric strength is more than approximately $10^7$ V/cm.

A variety of prior art ESD protection circuits are available. These prior art circuits can be based on Zener diodes, bipolar junction transistors, and/or field effect transistors (FETs). The circuits can be connected between input/output (I/O) pins and Vcc or Vss power supply pins. There have been many approaches to lower the ESD triggering voltages. One suggestion is found in U.S. Pat. No. 5,870,268 to Lin et al., which teaches generating, in response to an ESD event, a current spike that drives up the voltage of the P-well surrounding the ESD device. The higher P-well voltage lowers the trigger voltage of the ESD NMOS device. However, this approach requires additional circuitry.

It is often desired to have ESD devices built onto IC chips that can be reliably triggered at fairly low levels. As the sizes of the semiconductor MOS devices shrink to deep submicron scale, it becomes more difficult to control the "snapback" effect. Accordingly, there remains an unsatisfied need for more sensitive and faster responding ESD circuits. There is also a need for a simple IC structure that provides a low ESD trigger level reliably without extensive overhead circuitry and with an efficient use of IC space.

SUMMARY OF INVENTION

It is therefore the primary object of the present invention to provide a robust, sensitive and fast acting ESD protection device and ESD circuit thereof to solve the above-described problems.

It is another object of the present invention to provide an NMOS device having protection against electrostatic discharge, wherein the NMOS device has improved ESD performance and robustness.

It is still another object of the present invention to provide an NMOS device having protection against electrostatic discharge, wherein the NMOS device has improved ESD performance and occupies relatively small chip surface area.

According to one preferred embodiment of this invention, an electrostatic discharge (ESD) protection MOS device is provided. The ESD protection MOS device includes a silicon substrate of first conductivity type; an epitaxial silicon layer of the first conductivity type grown on the silicon substrate; a first ion well of the first conductivity type disposed in the epitaxial silicon layer; a second ion well of the second conductivity type disposed in the epitaxial silicon layer, the second ion well encompassing the first ion well and laterally isolating the first ion well; a buried layer of the second conductivity type disposed at interface between the silicon substrate and the epitaxial silicon layer, wherein the buried layer borders the second ion well, thereby fully isolating the first ion well; a first isolation structure consisting of a gate insulating layer and a field oxide layer, wherein the first isolation structure is formed on the epitaxial silicon layer between the first and second ion wells; a gate laid over the gate insulating layer and field oxide layer; a second isolation structure spaced apart from the first isolation structure, the second isolation structure being formed on the second ion well; a source doping region of the second conductivity type disposed in the first ion well between the gate insulating layer and the second isolation structure; and a drain doping region of the second conductivity type disposed in the second ion well between the field oxide layer and the second isolation structure.

From one aspect of this invention, an integrated circuit chip is provided. The integrated circuit chip includes at least one I/O pin, internal circuit, and an NMOS device having protection against electrostatic discharge. The NMOS device includes a P type silicon substrate; a P type epitaxial silicon layer grown on the silicon substrate; a P type first ion well disposed in the epitaxial silicon layer; a N type second ion well disposed in the epitaxial silicon layer, the second ion well encompassing the first ion well and laterally isolating the first ion well; a N type buried layer disposed underneath the first ion well, wherein the buried layer borders the second ion well, thereby fully isolating the first ion well from the silicon substrate; a first isolation structure consisting of a gate insulating layer and a field oxide layer, wherein the first isolation structure is formed on the epitaxial silicon layer between the first and second ion wells; a gate laid over the gate insulating layer and field oxide layer; a second isolation structure spaced apart from the first isolation structure, wherein the second isolation structure is substantially formed on the second ion well; an N type source doping region disposed in the first ion well between the gate insulating layer and the second isolation structure; and an N type drain doping region disposed in the second ion well between the field oxide layer and the second isolation structure. The internal circuit of the integrated circuit chip comprises a high-voltage (HV) NMOS device having the same structure as the NMOS device except that the HV NMOS device does not have the N type buried layer.

From another aspect of this invention, an integrated circuit chip is provided. The integrated circuit chip includes at least one I/O pin, internal circuit, and an NMOS device having protection against electrostatic discharge. The NMOS device includes a P type silicon substrate; a P type epitaxial silicon layer grown on the silicon substrate; a P type first ion well disposed in the epitaxial silicon layer; a N type second ion well disposed in the epitaxial silicon layer, the second ion well encompassing the first ion well and laterally isolating the first ion well; a N type buried layer disposed underneath the first ion well, wherein the buried layer borders the second ion well, thereby fully isolating the first ion well from the silicon substrate; a first isolation structure consisting of a gate insulating layer and a field oxide layer, wherein the first isolation structure is formed on the epitaxial silicon layer between the first and second ion wells; a gate laid over the gate insulating layer and field oxide layer; a second isolation structure spaced apart from the first isolation structure, wherein the second isolation structure is substantially formed on the second ion well; an N type source doping region disposed in the first ion well between the gate insulating layer and the second isolation structure; and an N type drain doping region disposed in the second ion well between the field oxide layer and the second isolation structure. The internal circuit of the integrated circuit chip comprises a high-voltage (HV) NMOS device having the same structure as the NMOS device except that the HV NMOS device has a buried diffusion layer with a doping concentration that is smaller than that of the N type buried layer of the NMOS device.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
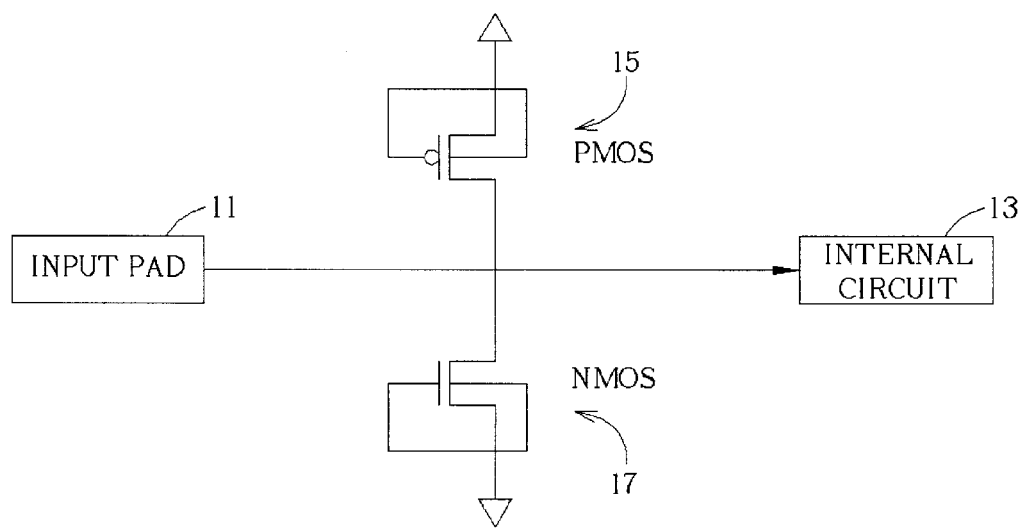
FIG. 1 is a schematic diagram showing ESD protection circuit for IC input pads and internal circuit of an IC chip.

FIG. 1 shows a schematic diagram of an ESD protection circuit for IC input pads. The on-chip ESD protection circuit is built in IC chips to protect the devices and circuits against ESD damage. An input/output pad 11 is provided for interface with the internal circuit 13 of an IC chip. A PMOS 15 and an NMOS 17 are disposed between the input/output pad 11 and the internal circuit 13. According to one embodiment, the PMOS 15 and NMOS 17 devices are configured with their gates coupled to their respective sources. In general, for input pad protection, the junction breakdown voltages of the NMOS 17 and PMOS 15 should be smaller than the gate oxide breakdown voltage.

Figure 2:
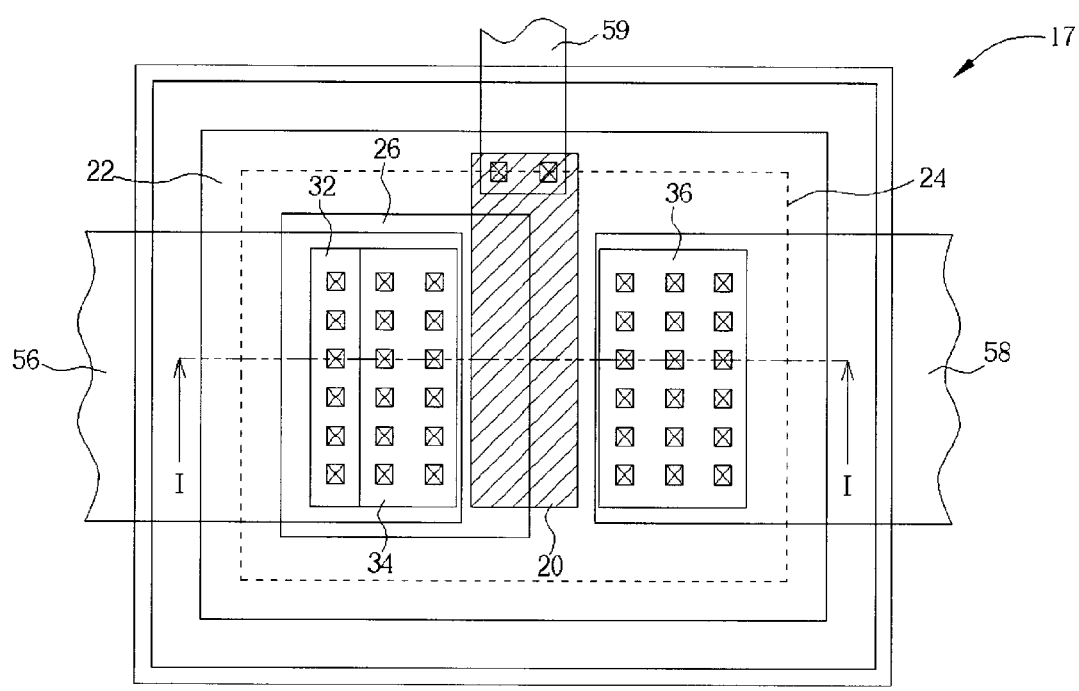
FIG. 2 is an enlarged plan view of the layout of the ESD protection NMOS device in accordance with the preferred embodiment of this invention.
Figure 3:
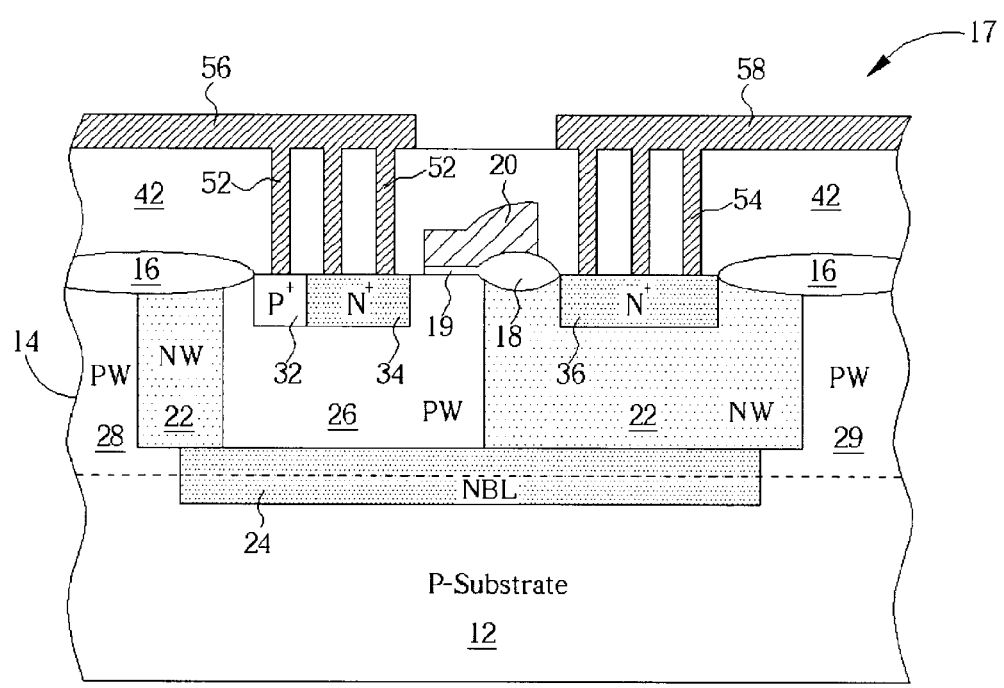
FIG. 3 is a schematic cross-sectional diagram showing the ESD protection NMOS device along line I—I of FIG. 2.

Referring to FIG. 2 and FIG. 3, wherein FIG. 2 is an enlarged plan view of the layout of the NMOS device 17 in accordance with the preferred embodiment of this invention; FIG. 3 is a schematic cross-sectional diagram showing the NMOS device 17 along line I—I of FIG. 2. According to the preferred embodiment of this invention, the NMOS device 17 is a high-voltage NMOS device that is fabricated fully compatible with standard 40V high-voltage semiconductor CMOS processes. The NMOS device 17 is disposed between I/O pins and internal circuit of an integrated circuit chip to provided on-chip ESD protection. The present invention is especially suitable for ESD protection on an output buffer of integrated circuits.

As shown in FIG. 2 and FIG. 3, the NMOS device 17 is fabricated on an epitaxial silicon layer 14 that is grown on a silicon substrate 12 using methods known in the art. The NMOS device 17 comprises a polysilicon gate 20 laid over an insulating layer 18 and a high-voltage gate-insulating layer (typically silicon oxide) 19. The insulating layer 18 is formed by conventional field oxide process known in the art. The high-voltage gate-insulating layer 19 has a film thickness that is the same as that of a high-voltage MOS device fabricated in the internal circuit (not shown) of the integrated circuit chip. In accordance with the preferred embodiment of this invention, the aforesaid high-voltage MOS device is a 40V high-voltage device.

On one side of the gate 20, an $N^+$ doping region 34 that is short-circuited with a $P^+$ doping region 32 is provided in the epitaxial silicon layer 14. The $N^+$ doping region 34 acts as a source terminal of the NMOS device 17. On the other side of the gate 20, an $N^+$ doping region 36 is provided in the epitaxial silicon layer 14, which acts as a drain terminal of the NMOS device 17. The $N^+$ doping region 36 is isolated from the gate 20 by the insulating layer 18. According to the preferred embodiment, the $N^+$ doping region 34, the $P^+$ doping region 32, and the gate of the NMOS device 17 are coupled to $V_{SS}$ or ground, but limited thereto.

The $P^+$ doping region 32 and the $N^+$ doping region 34 of the NMOS device 17 are formed in a P well 26. The $N^+$ doping region 36 of the NMOS device 17 is formed in an annular N well 22 that encompasses the P well 26 and laterally isolates the P well 26. Both the N well 22 and the P well 26 are formed in the epitaxial silicon layer 14. An $N^+$ buried layer (NBL) 24 is disposed under the P well 26. The NBL 24 borders the annular N well 22 and hence fully isolates the P well 26 from the silicon substrate 12.

According to the claimed invention, the NBL 24 is formed by ion implanting N type ion species such as phosphorus, arsenic or antimony into the silicon substrate 12 at implant dose that is greater than a specific value, followed by conventional epitaxial growing process and drive-in process. Accordingly, the NBL 24 is located at the interface between the silicon substrate 12 and the epitaxial silicon layer 14, as specifically indicated by the dash line in FIG. 3.

According to the preferred embodiment of this invention, the NBL 24 is formed by ion implanting antimony (Sb) into said silicon substrate at an implant dose of at least 1E15 atoms/cm$^2$ and at an implant energy of about 80 KeV. Preferably, the NBL 24 is formed by ion implanting antimony into said silicon substrate at an implant dose of about 2E15 atoms/cm$^2$ and at implant energy of about 80 KeV. Under such condition (Sb; dose: 2E15 atoms/cm$^2$ energy: 80 KeV), a significant improvement of the second breakdown current (It2) of the NMOS device 17 is obtained. According to the experimental data measured by a Transmission Line Pulse Generator (TLPG), a second breakdown current (It2) of about 2300 mA is achieved. It is surprisingly found that the additional implant of the NBL with controlled doping doses and energies can improve the ESD robustness of the NMOS device 17.

The present invention features the NBL 24 that is formed under controlled implant dose and energy conditions, and the annular N well 22, which in combination fully isolates the P well 26 that functions as a terminal of a parasitic bipolar junction transistor. It is believed that turn-on property of the parasitic bipolar junction transistor is further enhanced by tuning the conditions (dose and/or energy)

related to the formation of the NBL 24. The trigger voltage of the NMOS device 17 is reduced. It is advantageous to use the present invention because the NMOS device 17 occupies relatively smaller chip surface area. According to the preferred embodiment, the NMOS device has a channel width to length ratio of about 20/3 (W/L=20/3). The NMOS device 17 presents enhanced ESD performance and high ESD efficiency at small device area.

As shown in FIG. 2 and FIG. 3, a field oxide layer 16 is formed on the epitaxial silicon layer 14. The field oxide layer 16, which is spaced apart from the insulating layer 18, is approximately formed over the annular N well 22. The $P^+$ doping region 32 and the $N^+$ doping region 34 are formed between the field oxide layer 16 and the gate 20. The $N^+$ doping region 36 is formed between the field oxide layer 16 and the insulating layer 18. The NMOS device 17 further comprises a field P well 28 implant through the field oxide layer 16 into the epitaxial silicon layer 14. Further, as shown in FIG. 2, a guard ring structure 29 is provided. The guard ring structure 29 surrounds the NMOS device 17 and comprises a guard ring N well (not shown) adjacent to the field P well 28. According to the preferred embodiment, the guard ring structure 29 further comprises the aforesaid NBL directly underneath the guard ring N well.

As shown in FIG. 3, a dielectric layer 42 is deposited over the epitaxial silicon layer 14 and over the field oxide layer 16, insulating layer 18 and gate 20. Metal interconnection lines 56 and 58 are formed on the dielectric layer 42. The metal interconnection line 56 is electrically connected to the $P^+$ doping region 32 and $N^+$ doping region 34 via butting contact 52. According to the preferred embodiment, the $P^+$ doping region 32 and $N^+$ doping region 34 are coupled to the same voltage level such as $V_{SS}$. The metal interconnection line 58 is electrically connected to the $N^+$ doping region 36 via contact 54. According to the preferred embodiment, the $N^+$ doping region 36 is coupled to the I/O pin and internal circuit. Briefly referring back to FIG. 1, the gate 20 is coupled to the $N^+$ doping region 34.

To sum up, the NMOS device 17 of this invention is fabricated by using the same high-voltage processes that are used to fabricate high-voltage (HV) NMOS devices within the internal circuit of an integrated circuit chip, except that an additional ESD implant is carried out to form (or adjust) the NBL 24 under the NMOS device 17. Accordingly, except the NBL 24, the structures of the NMOS device 17 and the HV NMOS device within the internal circuit are the same. The NBL 24 that is formed under controlled implant dose and energy conditions, and the annular N well 22, which in combination fully isolates the P well 26 that functions as a terminal of a parasitic bipolar junction transistor. The turn-on property of the parasitic bipolar junction transistor is enhanced by tuning the conditions (dose and/or energy) related to the formation of the NBL 24. The trigger voltage of the NMOS device 17 is reduced.

Furthermore, in some cases that the HV NMOS device within the internal circuit also has the N-type buried layer (NBL) design, the additional ESD implant is then used to increase the doping concentration of the NBL 24 under the NMOS device 17 that has protection against electrostatic discharge. It is noted that in such case, the ESD protection NMOS device 17 has a NBL 24 with a doping concentration that is higher than the doping concentration of the NBL of the HV NMOS device within the internal circuit.

Those skilled in the art will readily observe that numerous modification and alterations of the invention may be made while retaining the teachings of the invention. Accordingly, the above disclosure should be construed as limited only by the metes and bounds of the appended claims.

What is claimed is:

1. An electrostatic discharge (ESD) protection MOS device, comprising:

a silicon substrate of first conductivity type;

an epitaxial silicon layer of said first conductivity type grown on said silicon substrate;

a first ion well of said first conductivity type disposed in said epitaxial silicon layer;

a second ion well of said second conductivity type disposed in said epitaxial silicon layer, said second ion well encompassing said first ion well and laterally isolating said first ion well;

a buried layer of said second conductivity type disposed at interface between said silicon substrate and said epitaxial silicon layer, wherein said buried layer borders said second ion well, thereby fully isolating said first ion well;

a first isolation structure consisting of a gate insulating layer and a field oxide layer, wherein said first isolation structure is formed on said epitaxial silicon layer between said first and second ion wells;

a gate laid over said gate insulating layer and field oxide layer;

a second isolation structure spaced apart from said first isolation structure, said second isolation structure being formed on said second ion well;

a source doping region of said second conductivity type disposed in said first ion well between said gate insulating layer and said second isolation structure; and a drain doping region of said second conductivity type disposed in said second ion well between said field oxide layer and said second isolation structure.

2. The ESD protection MOS device according to claim 1 wherein said first conductivity type is P type and said second conductivity type is N type.

3. The ESD protection MOS device according to claim 1 further comprising a heavily doping region of said first conductivity type disposed in said first ion well between said gate insulating layer and said second isolation structure, wherein said heavily doping region of said first conductivity type and said source doping region of said second conductivity type are shorted together to the same voltage level.

4. The ESD protection MOS device according to claim 1 further comprising a field ion well of said first conductivity type adjacent to said second ion well, wherein said field ion well is located directly under said second isolation structure.

5. The ESD protection MOS device according to claim 1 wherein said buried layer of said second conductivity type is formed by ion implanting antimony (Sb) into said silicon substrate at an implant dose of at least 1E15 atoms/cm$^2$ and at an implant energy of about 80 KeV.

6. The ESD protection MOS device according to claim 1 wherein said buried layer of said second conductivity type is formed by ion implanting antimony (Sb) into said silicon substrate at an implant dose of about 2E15 atoms/cm$^2$ and at an implant energy of about 80 KeV.

7. The ESD protection MOS device according to claim 1 having a channel width to length ratio (W/L) of about 20/3.

8. An integrated circuit chip comprising at least one I/O pin, internal circuit, and an NMOS device having protection against electrostatic discharge, said NMOS device comprising:

a P type silicon substrate;

a P type epitaxial silicon layer grown on said silicon substrate;

a P type first ion well disposed in said epitaxial silicon layer;

a N type second ion well disposed in said epitaxial silicon layer, said second ion well encompassing said first ion well and laterally isolating said first ion well;

a N type buried layer disposed underneath said first ion well, wherein said buried layer borders said second ion well, thereby fully isolating said first ion well from said silicon substrate;

a first isolation structure consisting of a gate insulating layer and a field oxide layer, wherein said first isolation structure is formed on said epitaxial silicon layer between said first and second ion wells;

a gate laid over said gate insulating layer and field oxide layer;

a second isolation structure spaced apart from said first isolation structure, wherein said second isolation structure is substantially formed on said second ion well;

an N type source doping region disposed in said first ion well between said gate insulating layer and said second isolation structure; and an N type drain doping region disposed in said second ion well between said field oxide layer and said second isolation structure;

wherein said internal circuit of said integrated circuit chip comprises a high-voltage (HV) NMOS device having the same structure as said NMOS device except that said HV NMOS device does not have said N type buried layer.

9. The integrated circuit chip according to claim 8 wherein said N type drain doping region of said NMOS device is biased to said I/O pin.

10. The integrated circuit chip according to claim 8 wherein said gate of said NMOS device is coupled to said N type source doping region.

11. The integrated circuit chip according to claim 8 wherein said NMOS device further comprises a P type field ion well adjacent to said second ion well, wherein said P type field ion well is located directly under said second isolation structure.

12. The integrated circuit chip according to claim 8 wherein said N type buried layer is formed by ion implanting antimony (Sb) into said silicon substrate at an implant dose of at least 1E15 atoms/cm$^2$ and at an implant energy of about 80 KeV.

13. The integrated circuit chip according to claim 8 wherein said N type buried layer is formed by ion implanting antimony (Sb) into said silicon substrate at an implant dose of about 2E15 atoms/cm$^2$ and at an implant energy of about 80 KeV.

14. The integrated circuit chip according to claim 8 wherein said NMOS device has a channel width to length ratio (W/L) of about 20/3.

15. The integrated circuit chip according to claim 8 wherein said HV NMOS device is a 40V HV NMOS device.

16. The integrated circuit chip according to claim 8 wherein said NMOS device further comprises a P type heavily doping region disposed in said first ion well between said gate insulating layer and said second isolation structure, wherein said P type heavily doping region and said N type source doping region are shorted together to the same voltage level.

17. The integrated circuit chip according to claim 16 wherein said voltage level is $V_{SS}$.

18. An integrated circuit chip comprising at least one I/O pin, internal circuit, and an NMOS device having protection against electrostatic discharge, said NMOS device comprising:

a P type silicon substrate;

a P type epitaxial silicon layer grown on said silicon substrate;

a P type first ion well disposed in said epitaxial silicon layer;

a N type second ion well disposed in said epitaxial silicon layer, said second ion well encompassing said first ion well and laterally isolating said first ion well;

a N type buried layer disposed underneath said first ion well, wherein said buried layer borders said second ion well, thereby fully isolating said first ion well from said silicon substrate;

a first isolation structure consisting of a gate insulating layer and a field oxide layer, wherein said first isolation structure is formed on said epitaxial silicon layer between said first and second ion wells;

a gate laid over said gate insulating layer and field oxide layer;

a second isolation structure spaced apart from said first isolation structure, wherein said second isolation structure is substantially formed on said second ion well;

an N type source doping region disposed in said first ion well between said gate insulating layer and said second isolation structure; and an N type drain doping region disposed in said second ion well between said field oxide layer and said second isolation structure;

wherein said internal circuit of said integrated circuit chip comprises a high-voltage (HV) NMOS device having the same structure as said NMOS device except that said HV NMOS device has a buried diffusion layer with a doping concentration that is smaller than that of said N type buried layer of said NMOS device.

19. The integrated circuit chip according to claim 18 wherein said N type drain doping region of said NMOS device is biased to said I/O pin.

20. The integrated circuit chip according to claim 18 wherein said gate of said NMOS device is coupled to said N type source doping region.

21. The integrated circuit chip according to claim 18 wherein said N type buried layer is formed by ion implanting antimony (Sb) into said silicon substrate at an implant dose of at least 1E15 atoms/cm$^2$ and at an implant energy of about 80 KeV.

22. The integrated circuit chip according to claim 18 wherein said NMOS device has a channel width to length ratio (W/L) of about 20/3.

23. The integrated circuit chip according to claim 18 wherein said HV NMOS device is a 40V HV NMOS device.

24. The integrated circuit chip according to claim 18 wherein said NMOS device further comprises a P type heavily doping region disposed in said first ion well between said gate insulating layer and said second isolation structure, wherein said P type heavily doping region and said N type source doping region are shorted together to the same voltage level.

25. The integrated circuit chip according to claim 24 wherein said voltage level is $V_{SS}$.

* * * * *